(12) United States Patent
Gröppel

(10) Patent No.: US 7,582,706 B2
(45) Date of Patent: Sep. 1, 2009

(54) LOW CHLORINE CONTENT EPOXY RESIN

(75) Inventor: Peter Gröppel, Neubiberg (DE)

(73) Assignee: Siemens Aktiengesellschaft, Munich (DE)

( * ) Notice: Subject to any disclaimer, the term of this patent is extended or adjusted under 35 U.S.C. 154(b) by 375 days.

(21) Appl. No.: 10/506,044

(22) PCT Filed: Feb. 28, 2003

(86) PCT No.: PCT/DE03/00715

§ 371 (c)(1),
(2), (4) Date: Apr. 5, 2005

(87) PCT Pub. No.: WO03/072627

PCT Pub. Date: Sep. 4, 2003

(65) Prior Publication Data

US 2005/0222381 A1    Oct. 6, 2005

(30) Foreign Application Priority Data

Feb. 28, 2002    (DE) ................. 102 08 743

(51) Int. Cl.
*C08G 59/06* (2006.01)
(52) U.S. Cl. ....................... 525/523; 528/87
(58) Field of Classification Search ........... None
See application file for complete search history.

(56) References Cited

U.S. PATENT DOCUMENTS

| | | | |
|---|---|---|---|
| 3,413,320 A | | 11/1968 | Cofer |
| 3,636,051 A | * | 1/1972 | Rosenthal et al. ........... 549/541 |
| 4,535,150 A | * | 8/1985 | Hunter ....................... 528/489 |
| 4,668,807 A | | 5/1987 | Darbellay et al. |
| 5,098,965 A | | 3/1992 | Bauer et al. |
| 5,783,713 A | | 7/1998 | Fenelli et al. |
| 6,211,389 B1 | | 4/2001 | Dimke |

FOREIGN PATENT DOCUMENTS

| | | | |
|---|---|---|---|
| CA | 802231 A | * | 12/1968 |
| JP | 58173116 A | | 10/1983 |
| JP | 58173118 A | | 10/1983 |
| JP | 61-252222 A | * | 11/1986 |
| JP | 1073652 A | | 3/1989 |
| JP | 1-263111 A | * | 10/1989 |
| JP | 2086148 A | | 3/1990 |
| JP | 2-103219 A | * | 4/1990 |
| JP | 2-123122 A | * | 5/1990 |
| JP | 7286030 A | | 10/1995 |
| JP | 8073563 A | | 3/1996 |
| JP | 10-36484 A | * | 2/1998 |
| JP | 11-349661 A | * | 12/1999 |
| JP | 2000239346 A | | 9/2000 |
| JP | 2001163876 A | | 6/2001 |

OTHER PUBLICATIONS

Patent Abstracts of Japan, vol. 1996, No. 07, Jul. 31, 1996 & JP 08 073563 A (Nippon Steel Chem Co. Ltd.), Mar. 19, 1996.

* cited by examiner

*Primary Examiner*—Robert Sellers
(74) *Attorney, Agent, or Firm*—Young & Thompson

(57) ABSTRACT

The invention relates to epoxy resins having an extremely low content of chlorine, particularly a low content of organically bound chlorine. The invention also relates to a production method during which total chlorine contents of less than 100 ppm in the epoxy resin are achieved by extracting solid epoxy resin particles, optionally after a prior comminution and/or reprecipitation. The use of these low-chlorine epoxy resins in the fields of electronics and/or electrical engineering considerably reduces the components' susceptibility to corrosion.

13 Claims, 1 Drawing Sheet

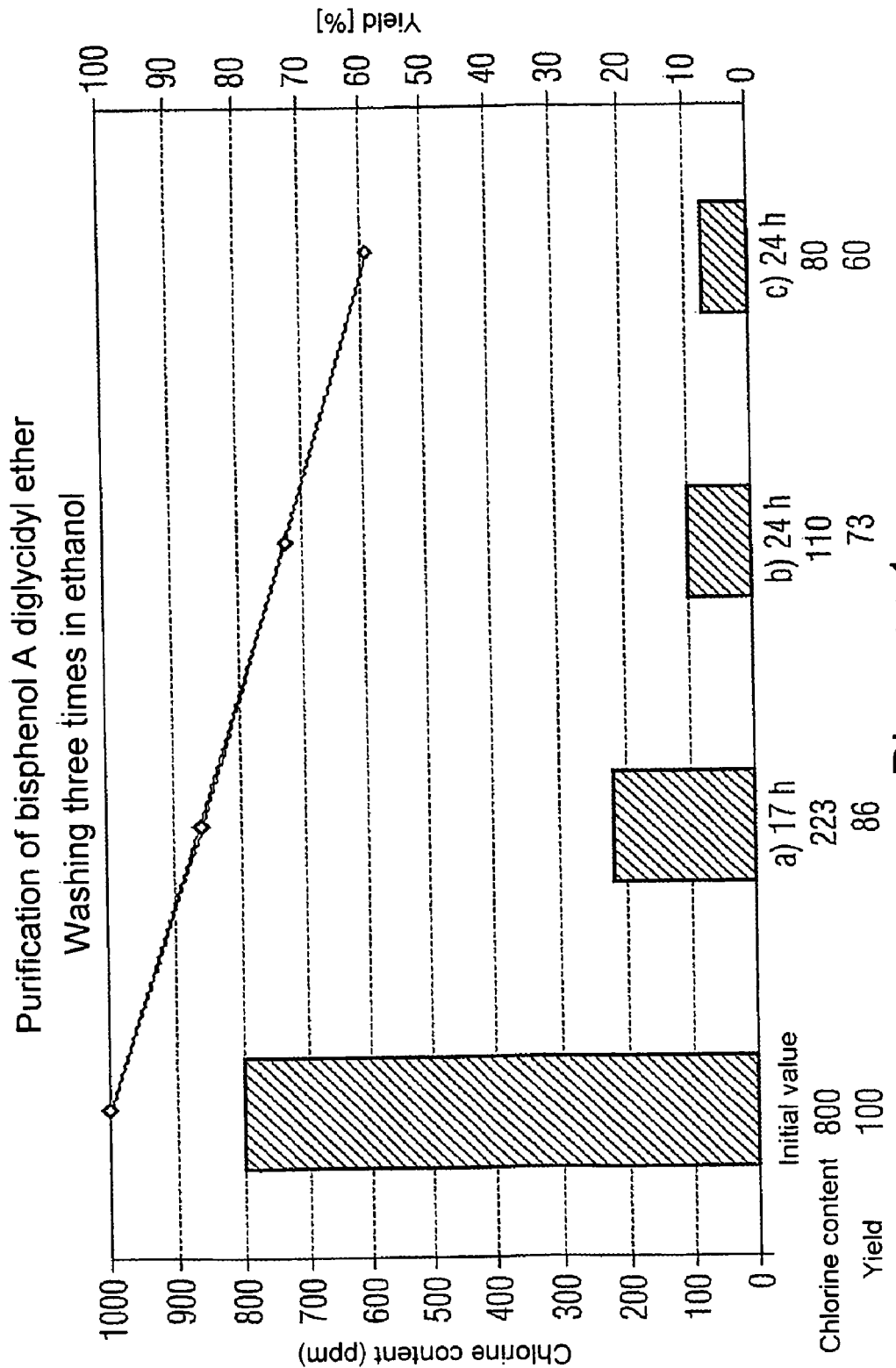

LOW CHLORINE CONTENT EPOXY RESIN

BACKGROUND OF THE INVENTION

1. Field of the Invention

The invention relates to epoxy resins having an extremely low content of chlorine, particularly a low content of organically bound chlorine.

2. Description of the Related Art

Epoxy resins have a broad range of applications within electronics and electrical engineering. They are used for molding compounds, glob top materials, printed circuit board materials, adhesives, underfillers, and films and for shielding electronic and optoelectronic components. Bisphenol A diglycidyl ether and bisphenol F diglycidyl ether frequently serve as base materials. As a rule, these are produced by causing the respective bisphenols to react with epichlorohydrin. The ionically bound chloride produced during synthesis can be removed to a low ppm by means of aqueous washing processes. In contrast, organic compounds containing chlorine which develop as byproducts and which cause the epoxy compounds to have a total chlorine content of up to 0.5 percent by weight are not removed by means of aqueous processing. Epoxy resins such as bisphenol A diglycidyl ether or bisphenol F diglycidyl ether with a total chlorine content of less than 100 ppm are hitherto unknown.

U.S. Pat. No. 3,413,320 discloses the purification of epoxy resins using recrystallization to total chlorine contents of approximately 0.37%. Nevertheless, as expected, this slight reduction in the chlorine content does not show any impact on the corrosive behavior of the epoxy resin.

The general assumption is thus that in air, in particular in the presence of heat and humidity, the organically bound chlorine is at least partially converted to chloride ions. Said ions can cause corrosion with parts coming into contact with them.

As a result it is necessary to make available epoxy resins with a low residual chlorine content, in particular of organically bound chlorine, which therefore have less of a tendency to cause corrosion.

BRIEF SUMMARY OF THE INVENTION

The object of the invention is thus to provide an epoxy resin, in particular a bisphenol diglycidyl ether which only has a negligible residual chlorine content. In addition, the object of the invention is to make available a production method therefore.

The present invention relates to an epoxy resin with a total chlorine content, said chlorine being present in organically and/or ionically bound form, of less than 100 ppm. Furthermore, the present invention relates to a method for reducing the chlorine content in epoxy resins, which is characterized in that the epoxy resin is extracted in solid form in a solvent.

According to an advantageous embodiment of the invention, the chlorine content can be reduced by extracting the resin in a solvent. In this way the resin is present in the form of solid particles. The particles, which can also be present in crystalline form in parts, are preferably comminuted beforehand. The particles can particularly preferably be comminuted by means of suitable reprecipitation. In addition, the respective resin is dissolved in a suitable solvent, preferably using heat, whereby the finest of droplets form in the solvent (dispersion) during cooling and are then extracted until the chlorine content has reduced correspondingly.

Extraction here refers to the removal of specific components of a solid mixture of substances using suitable solvents. A diffusion process takes place, which is initiated by the different component solubilities in the solvent.

According to a preferred embodiment of the invention, an organic solvent, such as alcohol, preferably a monovalent alcohol and particularly preferably methanol and/or ethanol, is used as the solvent for extraction, for example in a mixture with water. However all other solvents are suitable solvents, particularly a mixture of different alcohols, water and/or solvents. Here the term 'solvent' always refers to a solvent mixture.

According to an advantageous embodiment, the resin for extraction is agitated in a solvent, particularly preferably with the aid of a dispersion disk.

According to one embodiment, extraction and/or agitation takes place during the course of a temperature increase. It should be ensured that the epoxy resin remains solid at the relevant temperature and that the solvent does not evaporate.

The resins according to the invention were subjected to an electro-corrosion test on an adhesive formulation on an IPC (Integrated Plastic Circuit) test board, under the following conditions, 85° C. at 85% relative humidity for a period of 1000 hours.

BRIEF DESCRIPTION OF THE DRAWING FIGURE

FIG. 1 is a diagram showing how the chlorine content reduces successively during the extraction.

DETAILED DESCRIPTION OF THE PREFERRED EMBODIMENTS

The invention is described in more detail below with reference to an exemplary production method and a corrosion test carried out on exemplary embodiments of the epoxy resin according to the invention, such as an adhesive, a formulation for a printed circuit board laminate, a cast resin and an underfiller.

EXAMPLE 1

Purification of bisphenol A diglycidyl ether in ethanol 50 g of crystallized-out bisphenol A diglycidyl ether (Epliox® A-17-04, Leuna-Harze) with a total chlorine content of 800 ppm is suspended in 50 g of ethanol (p.a. Aldrich) and is comminuted with the aid of a rod mixer for a period of 60 seconds. The suspension is agitated in a closed vessel for 17 hours with the aid of a dispersion disk. It should thereby be ensured that the temperature of the suspension does not exceed 40° C. Subsequently, the mixture is filtered off in the water jet vacuum, rewashed with a little solvent and dried in the vacuum cabinet. The total chlorine content is then measures using the carbitol method.

This process is repeated twice. A 60% yield of bisphenol A diglycidyl ether is achieved with a total chlorine content of 80 ppm (see Diagram 1).

In FIG. 1 the diagram shows how the chlorine content reduces successively during the extraction.

EXAMPLE 2

Electro-corrosion Test on an Adhesive Formulation on IPC Test Boards.

Test specimens: 2 IPC test boards coated with adhesive.
Test specification applied: DIN EN 60068-2-67

Test: Climate test at 85° C. with 85% relative humidity, duration 1000 hours.
Test conditions: The test boards were subjected to 100 volts DC during the entire test period. To test for corrosion, the surface resistance below a leakage current of >1 mA or <$10^6 \Omega$ between adjacent comb pattern structures is indicated by means of luminescent diodes.

Composition of the Adhesive:
50 g bisphenol A diglycidyl ether, purified total chlorine content 42 ppm
50 g bisphenol F diglycidyl ether, purified total chlorine content 85 ppm
19.9 g tetraethylenediamine
0.5 g 2-methylimiadazole
0.5 g triethoxy epoxy propylsilane Result after 1000 Hour Test:
No visible signs of corrosion are detected.
No significant changes in the insulation resistance could be determined.
Measuring the insulation resistance before and after the 1000 hour climatic storage did not show any significant change in the resistance.

EXAMPLE 3

Electro-corrosion Test on a Formulation for Printed Circuit Board Laminates on IPC Test Boards.
Test specimens: 2 IPC test boards coated with a formulation for printed circuit board laminates.
Test specifications applied: DIN EN 60068-2-67
Test: Climate test at 85° C. with 85% relative humidity, duration 1000 hours
Test conditions: The test boards were subjected to 100 volts DC during the entire test period. To test for corrosion, the surface resistance below a leakage current of >1 mA or <$10^6 \Omega$ between adjacent comb pattern structures is indicated by means of luminescent diodes. The test layout is shown in FIG. 1 of example 2.

Composition of the Formulation for Printed Circuit Board Laminates:
100 g bisphenol A diglycidyl ether, purified total chlorine content 90 ppm
10.5 g dicyandiamine
0.5 g 2.4 ethyl methylimidazole
Result after 1000 hour test: no visible signs of corrosion are detected.
No significant changes in the insulation resistance could be determined.

EXAMPLE 4

Electro-corrosion Test on a Cast Resin on IPC Test Boards
Test specimens: 2 IPC test boards coated with cast resin
Test specification applied: DIN EN 60068-2-67
Test: Climate test at 85° C. with 85% relative humidity, duration 1000 hours
Test conditions: The test boards were subjected to 100 volts DC during the entire test period. To test for corrosion, the surface resistance below a leakage current of >1 mA or <$10^6 \Omega$ between adjacent comb pattern structures is indicated by means of luminescent diodes. The test layout is shown in FIG. 1 of example 2.

Composition of the Cast Resin
100 g bisphenol F diglycidyl ether, purified total chlorine content 70 ppm
90 g hexahydrophthalic acid anhydride
0.4 g dimethylbenzylamine
100 g translucent vitreous silica
Result: no visible signs of corrosion are detected.
No significant changes in the insulation resistance could be determined.

EXAMPLE 5

Electro-corrosion Test on an Underfiller on IPC Test Boards
Test specimens: 2 IPC test boards coated with underfiller
Test specification applied: DIN EN 60068-2-67
Test: Climate test at 85° C. with 85% relative humidity, duration 1000 hours
Test conditions: The test boards were subjected to 100 volts DC during the entire test period. To test for corrosion, the surface resistance below a leakage current of >1 mA or <$10^6$ $\Omega$ between adjacent comb pattern structures is indicated by means of luminescent diodes. The test layout is shown in FIG. 1 of example 2.

Composition of the Underfiller:
30 g bisphenol A diglycidyl ether, purified total chlorine contents 30 ppm
30 g bis-(epoxycyclohexyl)-methylcarboxylate
20 g hexahydrophthalic acid anhydride
80 g translucent vitreous silica (spherical)
Result: no visible signs of corrosion are detected.
No significant changes in the insulation resistance could be determined.

By using bisphenol A diglycidyl ether and/or bisphenol F diglycidyl ether with a total chlorine content <100 ppm in molding compounds, glob top materials, printed circuit board materials, adhesives, underfillers, films and to shield electronic and optoelectronic components with a total chlorine content <100 ppm, it was possible for the first time to formulate epoxy functional aromatic systems, having no corrosion according to DIN EN 60068-2-67, even after 1000 hours.

The invention enables such use for the first time.

The invention relates to epoxy resins having an extremely low content of chlorine, particularly a low content of organically bound chorine. The invention also relates to a production method during which total chlorine contents of less than 100 ppm in the epoxy resin are achieved by extracting solid epoxy resin particles, optionally after a comminution and/or reprecipitation. The use of these low-chlorine epoxy resins in the fields of electronics and/or electrical engineering considerably reduces the components' susceptibility to corrosion.

The invention claimed is:

1. A method for reducing chlorine content in epoxy resins, comprising the step of extracting the epoxy resin in solid form in a solvent, wherein the solvent and the epoxy resin are present in a 1:1 ratio regarding parts by weight, to obtain an extracted epoxy resin having a total chlorine content of less than 100 ppm of organically and ionically bound chlorine, wherein the solvent is at least one selected from the group consisting of an organic solvent, an alcohol, and a mixture thereof with water.

2. The method according to claim 1, wherein the epoxy resin is extracted in at least one of a solid and a partially crystalline form.

3. The method according to claim 2, wherein crystals from said partially crystalline form are comminuted beforehand.

4. The method according to claim 1, wherein at least one of an alcohol and an alcohol-water mixture is used as a solvent.

5. The method of claim 3, wherein at least one of an alcohol and an alcohol-water mixture is used as a solvent.

6. The method of claim 2, wherein at least one of an alcohol and an alcohol-water mixture is used as a solvent.

7. The method according to claim 1, wherein said method produces a yield of 60% of the extracted epoxy resin.

8. The method according to claim 1, in which successive extractions are performed.

9. The method according to claim 1, wherein said epoxy resin for extraction is agitated in said solvent during said extraction.

10. The method according to claim 1, wherein said extraction is performed during a temperature increase up to 40° C. and said epoxy resin remains solid at said temperature and the solvent does not evaporate.

11. The method according to claim 1, wherein said organic solvent is alcohol.

12. The method according to claim 11, wherein said alcohol is a monovalent alcohol.

13. The method according to claim 12, wherein said monovalent alcohol is methanol or ethanol.

* * * * *

UNITED STATES PATENT AND TRADEMARK OFFICE
CERTIFICATE OF CORRECTION

PATENT NO. : 7,582,706 B2 Page 1 of 1
APPLICATION NO. : 10/506044
DATED : September 1, 2009
INVENTOR(S) : Peter Gröppel It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 862 days.

Signed and Sealed this

Fourteenth Day of September, 2010

David J. Kappos
*Director of the United States Patent and Trademark Office*